United States Patent
Honda et al.

(10) Patent No.: US 8,287,645 B2
(45) Date of Patent: *Oct. 16, 2012

(54) PRODUCTION PROCESS FOR HIGH PURITY POLYCRYSTAL SILICON AND PRODUCTION APPARATUS FOR THE SAME

(75) Inventors: Shuichi Honda, Kumamoto (JP);
Minoru Yasueda, Kumamoto (JP);
Satoshi Hayashida, Kumamoto (JP);
Masatsugu Yamaguchi, Kumamoto (JP); Toru Tanaka, Kumamoto (JP)

(73) Assignee: JNC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/013,270

(22) Filed: Jan. 25, 2011

(65) Prior Publication Data

US 2011/0165032 A1    Jul. 7, 2011

Related U.S. Application Data

(62) Division of application No. 11/556,524, filed on Nov. 3, 2006, now Pat. No. 7,922,814.

(30) Foreign Application Priority Data

Nov. 29, 2005   (JP) .................................. 2005-344004
Feb. 21, 2006   (JP) .................................. 2006-043997

(51) Int. Cl.
*C30B 25/14*      (2006.01)

(52) U.S. Cl. .................. 117/200; 118/716; 118/718

(58) Field of Classification Search .................. 117/200; 118/716, 718
See application file for complete search history.

(56) References Cited

U.S. PATENT DOCUMENTS

| | | | |
|---|---|---|---|
| 2,867,306 A | 1/1959 | Pick et al. ........................ | 190/57 |
| 5,327,454 A | 7/1994 | Ohtsuki et al. ................ | 373/133 |
| 5,427,056 A | 6/1995 | Imai et al. ..................... | 117/214 |
| 5,469,200 A | 11/1995 | Terai ................ | 347/63 |
| 5,488,923 A | 2/1996 | Imai et al. ....................... | 117/33 |
| 5,661,503 A | 8/1997 | Terai ................ | 347/63 |
| 7,553,468 B2 | 6/2009 | Honda et al. .................. | 423/350 |
| 7,658,900 B2 | 2/2010 | Berthold et al. .............. | 423/350 |
| 2006/0270199 A1 | 11/2006 | Shimamune et al. ......... | 438/479 |
| 2007/0123011 A1 | 5/2007 | Honda et al. .................. | 438/488 |
| 2008/0226531 A1 | 9/2008 | Honda et al. .................. | 423/350 |
| 2008/0233036 A1 | 9/2008 | Hayashida .................... | 423/348 |
| 2008/0233037 A1 | 9/2008 | Namiki ......................... | 423/350 |
| 2008/0233038 A1 | 9/2008 | Hayashida .................... | 423/350 |
| 2009/0081380 A1 | 3/2009 | Endoh et al. .................. | 427/545 |
| 2009/0136408 A1 | 5/2009 | Endoh et al. .................. | 423/349 |
| 2009/0238992 A1 | 9/2009 | Endoh et al. .................. | 427/543 |

FOREIGN PATENT DOCUMENTS

| | | |
|---|---|---|
| JP | 55-023025 | 2/1980 |
| JP | 59-207830 | 11/1984 |
| JP | 62-030698 | 2/1987 |
| JP | 05-139891 | 6/1993 |
| JP | 2000-345218 | 12/2000 |
| JP | 2003-034519 | 2/2003 |
| JP | 2003-342016 | 12/2003 |
| JP | 2007-223822 | 9/2007 |
| WO | WO 2004/035472 | 4/2004 |

*Primary Examiner* — Bob M Kunemund
(74) *Attorney, Agent, or Firm* — J.C. Patents

(57) ABSTRACT

In the production process of the present invention for high purity polycrystal silicon, using a vertical reactor having a silicon chloride gas-feeding nozzle and a reducing agent gas-feeding nozzle which are disposed at an upper part and a waste gas discharge pipe, a silicon chloride gas and a reducing agent gas are fed into the reactor to form polycrystal silicon at a tip part of the silicon chloride gas-feeding nozzle by the reaction of the silicon chloride gas with the reducing agent gas, and the polycrystal silicon is allowed to grow from the tip part of the silicon chloride gas-feeding nozzle toward a lower part thereof.

6 Claims, 5 Drawing Sheets

Fid. 3
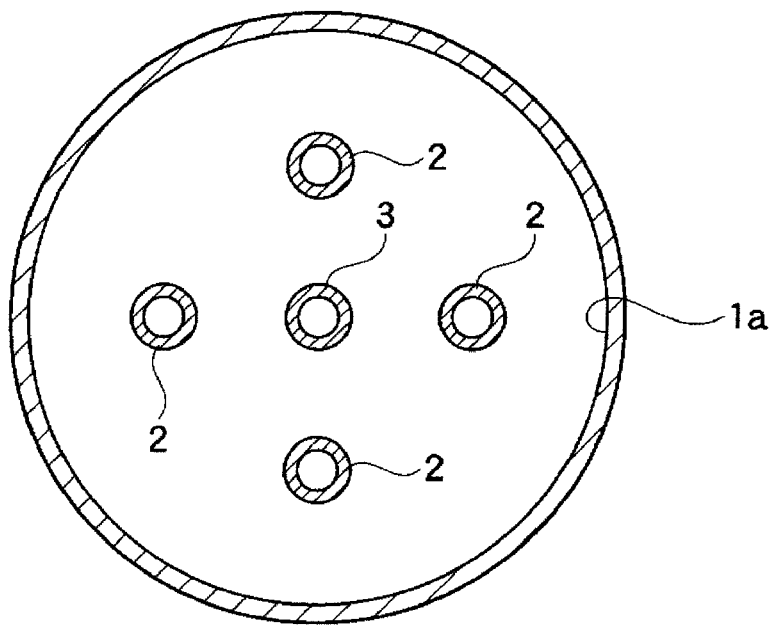
Fig. 4
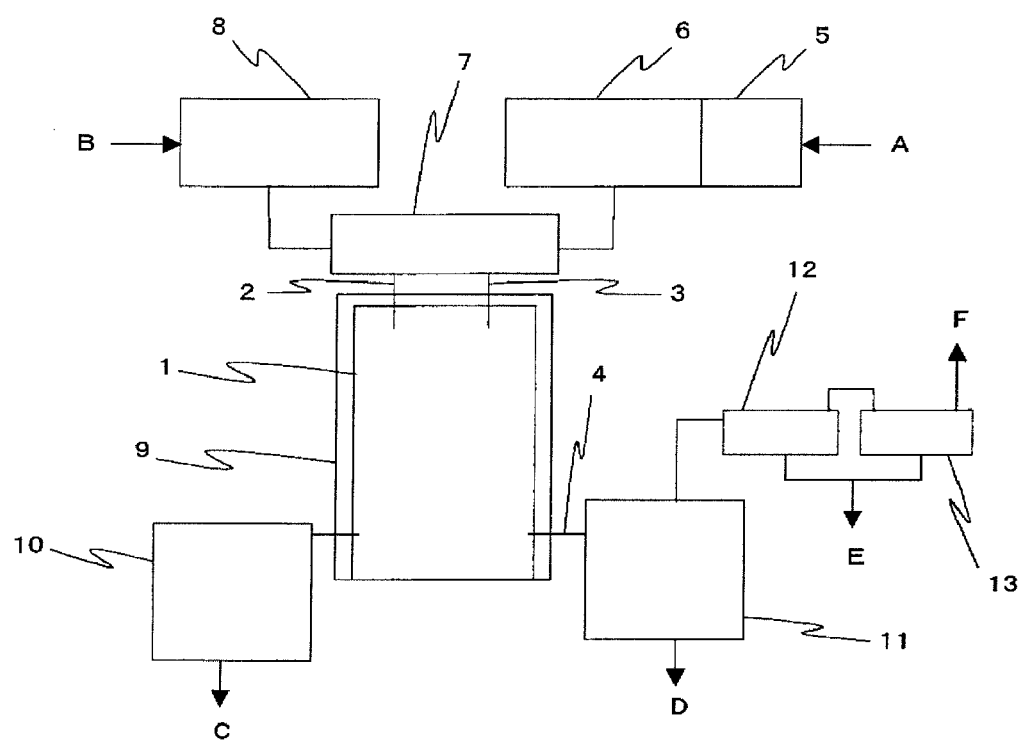

PRODUCTION PROCESS FOR HIGH PURITY POLYCRYSTAL SILICON AND PRODUCTION APPARATUS FOR THE SAME

CROSS-REFERENCE TO RELATED APPLICATION

This application is a divisional application of, and claims the priority benefit of, U.S. application Ser. No. 11/556,524, filed on Nov. 3, 2006, now U.S. Pat. No. 7,922,814 which in turn claims the priority benefits of Japan application No. 2005-344004, filed on Nov. 29, 2005 and Japan application No. 2006-043997, filed on Feb. 21, 2006. The contents of these prior applications are hereby incorporated by reference in their entirety.

BACKGROUND OF THE INVENTION

1. Field of the Invention

The present invention relates to a production process for high purity polycrystal silicon which is a raw material of silicon for semiconductors and silicon for solar batteries and a production apparatus for the same.

2. Description of the Related Art

Polycrystal silicon is used as a raw material of silicon for semiconductors and as a raw material of silicon for solar batteries. In the state that popularization of solar batteries is expanded to a large extent particularly in recent years, demand to polycrystal silicon which is a raw material therefor is increased as well.

However, the existing state is that a crucible residue obtained after pulling up single crystal silicon for semiconductors and scrapped products such as cutting scraps of a single crystal silicon ingot are used as polycrystal silicon which is a raw material of silicon for solar batteries. Accordingly, polycrystal silicon used for solar batteries depends on the movement of the semiconductor industry in terms of both quality and amount, and as a result thereof, it stays in the situation that it is chronically short.

In this connection, a representative production process for high purity polycrystal silicon which is a raw material of single crystal silicon for semiconductors includes a Siemens process. In this Siemens process, high purity polycrystal silicon is obtained by hydrogen reduction of trichlorosilane (HSiCl$_3$) (refer to, for example, U.S. Pat. No. 2,867,306).

In a conventional Siemens process, seed bars 50 of silicon are put, as shown in a production apparatus 60 in FIG. 6, in a reactor 30 of a water-cooled bell jar type; an electric current is applied through the above seed bars 50 of silicon to heat the seed bars 50 to about 1000° C.; trichlorosilane (HSiCl$_3$) and hydrogen (H$_2$) of a reducing agent are introduced into the reactor 30 from a lower part to reduce silicon chloride; and resulting silicon is adhered selectively onto the surfaces of the seed bars 50, whereby bar-like polycrystal silicon is obtained. The above Siemens process has, in addition to the advantage that the raw material gas is vaporized at a relatively low temperature, the advantage in terms of an apparatus that the atmosphere is readily sealed since the reactor 30 itself is cooled with water, and therefore it has so far been widely popularized and employed.

In the Siemens process, however, the seed bars 50 is allowed to generate heat by applying an electric current, and therefore as bar-like silicon grows by adhesion of polycrystal silicon to allow an electric resistance to be slowly reduced, excessive electricity for heating has to be applied. Accordingly, the growth limit is present because of a balance with the energy cost, and involved therein are the problems that the production efficiency is inferior since the production facility is operated by a batch system and that an electric power consumption rate accounts for a large proportion in the price of polycrystal silicon which is the product.

Further, the seed bars 50 require specific facilities such as a dedicated reaction apparatus, a single crystal pulling-up apparatus and a cutting apparatus and specific techniques therefor in producing, and therefore the seed bars 50 themselves have become expensive.

Production processes for polycrystal silicon other than the Siemens process includes, for example, processes in which it is produced by reduction of silicon tetrachloride (SiCl$_4$) using metal reducing agents (refer to, for example, Japanese Patent Application Laid-Open No. 34519/2003 and Japanese Patent Application Laid-Open No. 342016/2003). To be specific, it is a process in which gases of silicon tetrachloride and zinc (Zn) are supplied into a lateral reactor made of quartz which is heated at about 1000° C., whereby polycrystal silicon is allowed to grow in the reactor.

Supposing that in the process described above, by-produced zinc chloride (ZnCl$_2$) is separated into zinc and chlorine by a method such as electrolysis to use again resulting zinc as a reducing agent and that resulting chlorine is reacted with inexpensive metal silicon to thereby synthesize silicon tetrachloride, which can be used as the raw material gas, a process of a recycling system is constituted, and therefore involved therein is the possibility that polycrystal silicon can be produced at a low cost.

In the above process, however, the polycrystal silicon obtained by the reaction grows from the wall of the reactor and therefore is liable to be exerted by an effect of contamination from the material of the reactor. Further, the above quartz-made lateral reactor has involved the problem that the polycrystal silicon is inferior in a production efficiency in addition to the problem that the reactor itself is broken due to a difference in a thermal expansion coefficient from that of the polycrystal silicon.

SUMMARY OF THE INVENTION

The production process of the present invention for high purity polycrystal silicon is characterized by using a vertical reactor comprising a silicon chloride gas-feeding nozzle, a reducing agent gas-feeding nozzle and a waste gas discharge pipe, in which the silicon chloride gas-feeding nozzle is inserted and installed from an upper part of the reactor into an inside of the reactor, feeding a silicon chloride gas from the silicon chloride gas-feeding nozzle and a reducing agent gas from the reducing agent gas-feeding nozzle into the reactor, forming polycrystal silicon at a tip part of the silicon chloride gas-feeding nozzle by the reaction of the silicon chloride gas with the reducing agent gas and allowing the polycrystal silicon to grow from the tip part of the silicon chloride gas-feeding nozzle toward a lower part thereof.

Further, the production apparatus for high purity polycrystal silicon according the present invention is equipped with:
a vertical reactor provided with a heating means on an outer circumferential surface,
a silicon chloride gas-feeding nozzle inserted into the vertical reactor from an upper part to a lower part thereof,
a reducing agent gas-feeding nozzle inserted into the vertical reactor from an upper part to a lower part thereof and
a waste gas discharge pipe connected with the reactor,
wherein polycrystal silicon is allowed to grow in order at a tip part of the silicon chloride gas-feeding nozzle by the gas phase reaction of a silicon chloride gas introduced from the silicon chloride gas-feeding nozzle with a reducing agent gas introduced from the reducing agent gas-feeding nozzle, and a plurality of the silicon chloride gas-feeding nozzles is installed apart by a prescribed distance from an inner wall of the reactor so as to surround the reducing agent gas-feeding nozzle, whereby silicon crystal formed in the reactor is adhered to the tip part of the silicon chloride gas-feeding nozzle, and then it is coagulated and allowed to grow in a tubular form toward a lower part.

BRIEF DESCRIPTIONS OF THE DRAWINGS

FIG. 1 is an outline drawing showing a fundamental constitution of a production apparatus for high purity polycrystal silicon related to one example of the present invention, wherein FIG. 1(a) is a schematic drawing of a vertical reactor; FIG. 1(b) is a schematic drawing showing a flow of a reducing agent gas in the reactor; FIG. 1(c) is a schematic drawing showing a flow of a silicon chloride gas; FIG. 1(d) is a schematic drawing showing the reaction of the reducing agent gas with the silicon chloride gas; and FIG. 1(e) is a schematic drawing showing a step in which tubular coagulated polycrystal silicon is produced.

FIG. 2 shows a gas guiding means provided at an aperture part of the silicon chloride gas-feeding nozzle adopted in the example shown in FIG. 1, wherein FIG. 2(a) is a cross-sectional drawing of the guiding means constituted by forming a wall of an aperture end surface in a small thickness; FIG. 2(b) is a schematic drawing of the guiding means constituted so that it assumes roundness; and FIG. 2(c) is a schematic drawing of a nozzle tip part when the guiding means is not particularly constituted.

FIG. 3 is a plain drawing showing one example of an installation embodiment of the silicon chloride gas-feeding nozzle versus the reducing agent gas-feeding nozzle.

FIG. 4 is an outline constitutional drawing of a production facility equipped with the production apparatus of the present invention shown in FIG. 1.

EXPLANATIONS OF THE CODES

Figure 1:
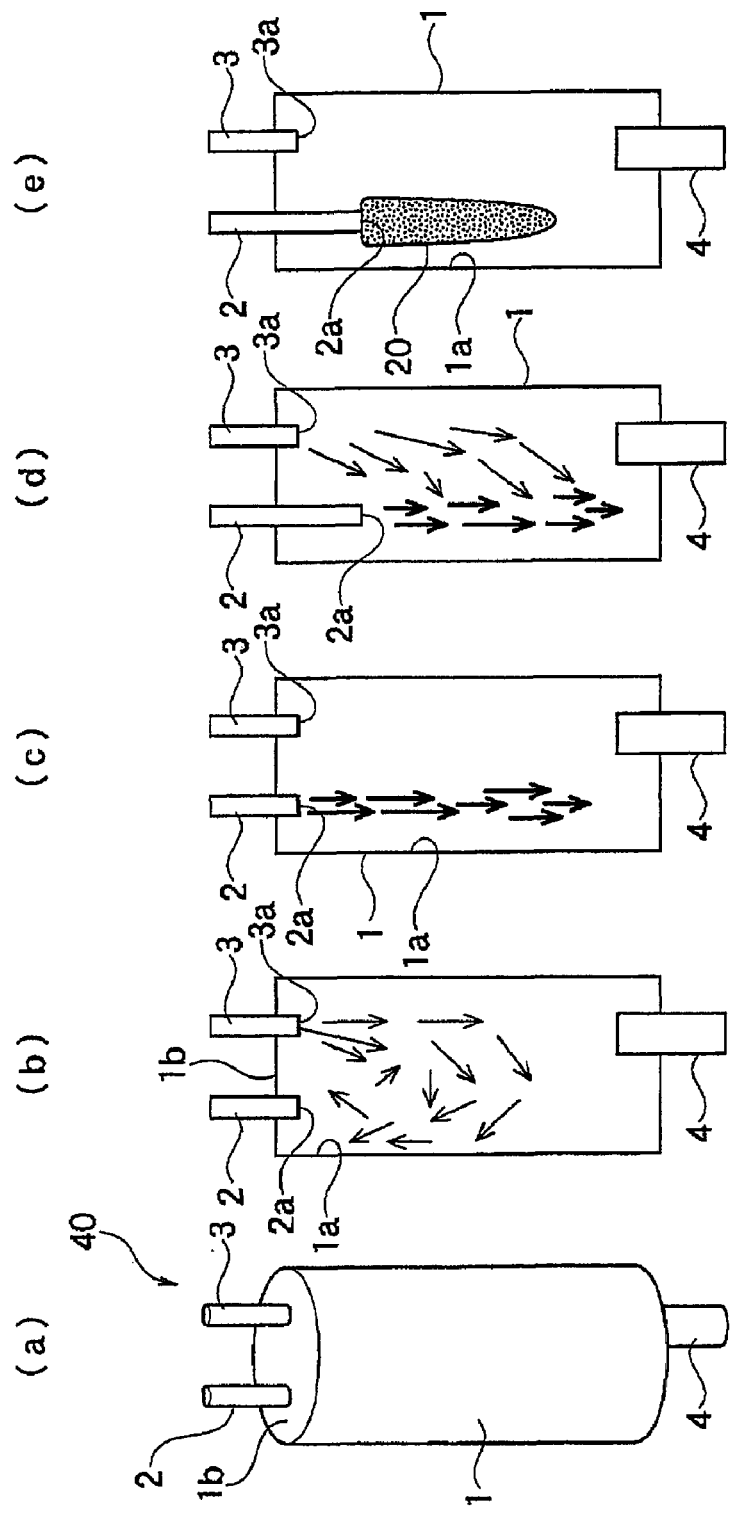

1 Vertical reactor
1a Apparatus wall
1b Top panel
1c Partition wall
1A Small chamber
1B Reaction chamber
2 Silicon chloride gas-feeding nozzle
2a Aperture end
2b Down flow side part
2c Upper flow side part
3 Reducing agent gas-feeding nozzle
3a Aperture end
4 Waste gas discharge pipe
5 Melting furnace
6 Evaporating furnace
7 Overheating furnace
8 Vaporizing device
9 Reactor heating furnace
10 Cooling•crushing device
11 Reducing agent chloride recovering tank
12 Silicon chloride condensing device (1)
13 Silicon chloride condensing device (2)
20 Tubular coagulated polycrystal silicon
30 Reactor
40 Production apparatus
50 Seed bars
60 Production apparatus
A Reducing agent
B Silicon chloride
C Polycrystal silicon dropped off
D Reducing agent chloride
E Unreacted silicon chloride
F Waste gas disposing equipment
G Diameter
H Insertion length
I Guide means
t Wall thickness

DETAILED DESCRIPTION OF THE INVENTION

The present inventors have found that high purity polycrystal silicon can continuously be produced in a large amount at a relatively low cost by a production process for high purity polycrystal silicon in which a silicon chloride gas and a reducing agent gas are fed into a specific vertical reactor to form polycrystal silicon at a tip part of the silicon chloride gas-feeding nozzle and in which it is allowed to grow from the tip part of the above nozzle toward a lower part thereof. Thus, they have completed the present invention.

The production process of the present invention for high purity polycrystal silicon is characterized by using a vertical reactor comprising a silicon chloride gas-feeding nozzle, a reducing agent gas-feeding nozzle and a waste gas discharge pipe, in which the silicon chloride gas-feeding nozzle is inserted and installed in an inside of the reactor from an upper part of the reactor, feeding a silicon chloride gas from the silicon chloride gas-feeding nozzle and a reducing agent gas from the reducing agent gas-feeding nozzle into the reactor, forming polycrystal silicon at a tip part of the silicon chloride gas-feeding nozzle by the reaction of the silicon chloride gas with the reducing agent gas and allowing the polycrystal silicon to grow from the tip part of the silicon chloride gas-feeding nozzle toward a lower part thereof.

The production process of the present invention for high purity polycrystal silicon may comprise a step for continuously taking out the polycrystal silicon to the outside of the reactor.

The step for taking out the polycrystal silicon to the outside of the reactor can be carried out by allowing the polycrystal silicon to fall into a cooling zone provided at a lower part of the vertical reactor by an own weight thereof or by a mechanical method to cool it and then discharging it from the bottom of the vertical reactor.

The step for taking out the polycrystal silicon to the outside of the reactor can be carried out as well by allowing the polycrystal silicon to fall into a lower part of the vertical reactor by an own weight thereof or by a mechanical method, melting the polycrystal silicon by heating the lower part of the above vertical reactor to a temperature of not lower than a melting point of silicon and then discharging it from the bottom of the vertical reactor in the form of a silicon melt.

In the production process of the present invention for high purity polycrystal silicon, the polycrystal silicon grows preferably without being brought into contact with an inner wall surface of the vertical reactor.

In the production process of the present invention for high purity polycrystal silicon, the silicon chloride gas is preferably reacted with the reducing agent gas at 800° C. to 1200° C.

In the production process of the present invention for high purity polycrystal silicon, a face direction of the polycrystal silicon in a crystal growth direction is preferably a (111) face.

The silicon chloride gas is preferably at least one gas selected from the group consisting of chlorosilanes represented by $Si_mH_nCl_{2m+2-n}$ (m is an integer of 1 to 3, and n is an integer of 0 or more which does not exceed 2m+2), and it is more preferably a silicon tetrachloride gas.

The reducing agent gas is preferably a gas of at least one selected from the group consisting of sodium, potassium, magnesium, zinc and hydrogen, and it is more preferably a zinc gas.

Further, the production apparatus for high purity polycrystal silicon according the present invention is equipped with:

a vertical reactor provided with a heating means on an outer circumferential surface, a silicon chloride gas-feeding nozzle inserted into the vertical reactor from an upper part to a lower part thereof, a reducing agent gas-feeding nozzle inserted into the vertical reactor from an upper part to a lower part thereof and a waste gas discharge pipe connected with the reactor, wherein polycrystal silicon is allowed to grow in order at a tip part of the silicon chloride gas-feeding nozzle by the gas phase reaction of a silicon chloride gas introduced from the silicon chloride gas-feeding nozzle with a reducing agent gas introduced from the reducing agent gas-feeding nozzle, and a plurality of the silicon chloride gas-feeding nozzles is installed apart by a prescribed distance from an inner wall of the reactor so as to surround the reducing agent gas-feeding nozzle, whereby silicon crystal formed in the reactor is adhered to the tip part of the silicon chloride gas-feeding nozzle, and then it is coagulated and allowed to grow in a tubular form toward a lower part.

According to the present invention comprising the above constitution, the polycrystal silicon growing on the tip part of the silicon chloride gas-feeding nozzle grows approximately toward a lower part thereof in the state that it is not brought into contact with the wall of the reactor, and therefore high purity silicon can continuously be produced.

Further, a plurality of the silicon chloride gas-feeding nozzles is installed, and therefore a limited space is efficiently used to make it possible to produce a large amount of polycrystal silicon.

In this regard, an aperture end of the reducing agent gas-feeding nozzle is preferably disposed at an upper part than an aperture end of the silicon chloride gas-feeding nozzle.

If the above constitution is assumed, the reducing agent gas can sufficiently be dispersed in the reactor by virtue of a difference in a specific gravity of gases, and therefore the reducing agent gas can sufficiently be reacted with the silicon chloride gas. Further, the silicon chloride gas does not flow back to the tip of the reducing agent gas-feeding nozzle, and therefore silicon crystal can be coagulated and allowed to grow in a tubular form only on the aperture end of the silicon chloride gas-feeding nozzle without allowing polycrystal silicon to grow on the aperture end of the reducing agent gas-feeding nozzle.

In the present invention, a gas guide means for guiding a gas flow downward is preferably worked at the aperture end of the silicon chloride gas-feeding nozzle.

If the above constitution is assumed, the silicon chloride gases discharged from the plural nozzles are injected straightly downward in the form of a laminar flow without exerting an effect on each other, and therefore polycrystal silicons coagulated in a tubular form can continuously be allowed to grow at a lower part.

Further, the gas guide means may be constituted so that an interfacial surface of the nozzle is formed in a smaller thickness toward the aperture end thereof.

If the above constitution is assumed, a gas flow discharged from the nozzle can relatively readily be injected straightly downward.

According to the production process of the present invention, the vertical reactor is used, and polycrystal silicon (hereinafter referred to as [tubular coagulated polycrystal silicon]) in which silicon crystal is coagulated in a tubular form can be formed immediately under the silicon chloride gas-feeding nozzle provided at an upper part of the reactor. This makes it possible to allow polycrystal silicon to continuously grow without using a seed bar as is the case with the Siemens process.

In the production process of the present invention, polycrystal silicon comes off from the nozzle by its own weight and falls as it grows, and therefore clogging of the nozzle is not caused. The polycrystal silicon obtained in the present invention can be allowed to fall down by a mechanical method such as vibrating and scratching after allowed to grow to a suitable length. The polycrystal silicon thus fallen is cooled in a cooling zone provided at a lower part of the reactor or molten by heating a lower part of the reactor at a temperature of not lower than a melting point of silicon to prepare a silicon melt, and then it can continuously be taken out to the outside of the reactor.

According to the production process of the present invention, the polycrystal silicon grows in the state that it hangs down from the nozzle and is not brought into contact with an inner wall of the reactor, and therefore it is substantially free from mixing of impurities originating in the reactor. Accordingly, a material constituting the reactor is not limited and can freely be selected from materials having a resistance in a use temperature range. Further, the polycrystal silicon obtained has a high purity because of the reasons described above and can be used as a raw material for semiconductors in addition to a raw material for solar batteries.

Hence, according to the production process of the present invention, a large amount of polycrystal silicon having a high purity can continuously be produced stably at a low cost without stopping the operation.

According to the production apparatus of the present invention, polycrystal silicon coagulated in a tubular form can continuously be formed toward a lower part immediately under the silicon chloride gas-feeding nozzle provided at an upper part of the reactor, and silicon can be allowed to grow without being brought into contact with the wall of the apparatus. Accordingly, contamination through the apparatus wall is prevented, and polycrystal silicon having a high purity can be produced.

In the production apparatus of the present invention, polycrystal silicon is coagulated and formed in a tubular form toward a lower part, and therefore clogging of the nozzle is not caused. The polycrystal silicon obtained in the present invention can be allowed to fall down by a mechanical method such as vibrating and scratching off after allowed to grow to a suitable length.

According to the production apparatus of the present invention, the polycrystal silicon grows in the state that it is not brought into contact with an inner wall of the reactor and hangs down from the nozzle, and therefore a material constituting the reactor is not limited and can freely be selected from materials having a resistance in a use temperature range.

Further, the polycrystal silicon obtained has a high purity because of the reasons described above and can be used as a raw material for silicon for semiconductors in addition to a raw material for silicon for solar batteries.

Also, the reducing agent gas can sufficiently be reacted with the silicon chloride gas without allowing polycrystal silicon to grow on the aperture end of the reducing agent gas-feeding nozzle by disposing an aperture end of the reducing agent gas-feeding nozzle at an upper part than an aperture end of the silicon chloride gas-feeding nozzle.

Further, if a gas guide means for guiding silicon chloride downward is worked at an aperture end of the silicon chloride gas-feeding nozzle so that a thickness thereof is reduced as it is closer to the aperture end part, the silicon chloride gas is guided so that it flows straightly downward, and therefore when the reducing agent gas is fed here, polycrystal silicon can be allowed to grow straightly downward.

The production process and the production apparatus for high purity polycrystal silicon related to one example of the present invention shall be explained below in details with reference to the drawings.

The high purity polycrystal silicon in the present invention means polycrystal silicon having a purity of 99.99% or more, preferably 99.999% or more which can be used as a raw material for silicon for solar batteries and as a raw material for silicon for semiconductors.

FIG. 1 shows a fundamental constitution of the production apparatus for high purity polycrystal silicon related to one example of the present invention.

In a production apparatus 40 for high purity polycrystal silicon in the present example, employed is an almost cylindrical vertical reactor 1 as shown in FIG. 1(*a*) to (*e*). The vertical reactor in the present invention means a reactor in which a flow of feeding the raw materials, reaction and taking out the product is carried out along an upper and lower direction in principle. On the other hand, a lateral reactor means a reactor in which the above flow is carried out along a horizontal direction.

A silicon chloride gas-feeding nozzle 2 and a reducing agent gas-feeding nozzle 3 each are inserted from an upper part of the vertical reactor 1 to a lower part thereof, and a waste gas discharge pipe 4 is connected with a lower part of the reactor 1. Silicon chloride and a reducing agent each are fed into the reactor 1 through the respective nozzles in the state that an inside of the reactor 1 is maintained at a prescribed temperature to carry out gas phase reaction in the inside of the reactor 1, and polycrystal silicon 20 slowly coagulated in a tubular form is allowed to grow downward at an aperture end 2*a* of the silicon chloride gas-feeding nozzle 2. In particular, the silicon chloride gas-feeding nozzle 2 has to be disposed particularly at a position which is apart by a prescribed distance from an apparatus wall 1*a*.

As shown in FIG. 1(*b*), the reducing agent gas fed from the reducing agent gas-feeding nozzle 3 to the reactor 1 is filled while diffused in the reactor 1 because of a small specific gravity thereof. On the other hand, the silicon chloride gas fed from the silicon chloride gas-feeding nozzle 2 is liable, as shown in FIG. 1(*c*), to fall straightly downward because of a large specific gravity thereof. Accordingly, the high purity polycrystal silicon in the present invention starts growing from an immediately lower part of the silicon chloride gas-feeding nozzle and grows toward a lower part of the reactor along a nozzle circumference brought into contact with the reducing agent gas.

If an aperture end 2*a* of the silicon chloride gas-feeding nozzle 2 and an aperture end 3*a* of the reducing agent gas-feeding nozzle 3 are set, as shown in FIGS. 1(*b*) and (*c*), at almost the same height, the reducing agent such as zinc discharged from the reducing agent gas-feeding nozzle 3 is insufficiently diffused and is not sufficiently used for reaction with the silicon chloride gas, and it is liable to be discharged from the waste gas discharging pipe 4 at a lower part to the outside of the reactor 1 as it stays unreacted.

Because of the above reason, the aperture end 3*a* of the reducing agent gas-feeding nozzle 3 is preferably disposed, as shown in FIGS. 1(*d*) and (*e*), at an upper part than the aperture end 2*a* of the silicon chloride gas-feeding nozzle 2 in the production apparatus 40 of the present example.

Setting the heights of the respective nozzles 2 and in the manner described above makes it possible to efficiently react the reducing agent gas such as zinc with the silicon chloride gas such as silicon tetrachloride.

The reducing agent gas and the silicon chloride gas are subjected to gas phase reaction in the reactor 1, whereby polycrystal silicon 20 obtained by the reaction is first adhered at the aperture end 2*a* of the silicon chloride gas-feeding nozzle 2 as time passes and then grows downward, and tubular coagulated polycrystal silicon 20 is produced. The silicon chloride gas-feeding nozzle 2 is disposed in advance at a position apart by a prescribed distance from the apparatus wall 1*a*, and therefore the above tubular coagulated polycrystal silicon 20 is not brought into contact with the apparatus wall 1*a* in the course of growing downward. Accordingly, contamination from the apparatus wall 1*a* is prevented, and the tubular coagulated polycrystal silicon having a high purity can be produced.

The vertical reactor 1 used in the present invention shall not specifically be restricted, and any one can be used as long as it is possible to disperse the reducing agent gas evenly in the apparatus and control the flow of the gas so that the silicon chloride gas falls linearly from the nozzle to allow tubular coagulated polycrystal silicon to grow at an immediately lower part of the nozzle. However, considering the behavior of the flow of the gas, preferred is a vertical reactor equipped with the feeding nozzle 2 for the silicon chloride gas and the feeding nozzle 3 for the reducing agent gas respectively at a circular top panel 1*b* or a vertical reactor in which the circular top panel 1*b* assumes a dome form and in which the respective nozzles 2 and 3 are equipped at the circular top panel 1*b* of the dome form.

For example, if the reactor is elongated, it is considered that in the vertical reactor 1, the silicon chloride gas falling in the reactor is gradually diffused as it falls and that it starts spreading to a lateral direction before long to allow the flow to be disturbed. In the present example, however, tubular coagulated polycrystal silicon grows toward a lower part of the vertical reactor 1, and therefore provided is the same effect as that in a case where a tip position of the nozzle is elongated downward with the passage of time.

Figure 2:
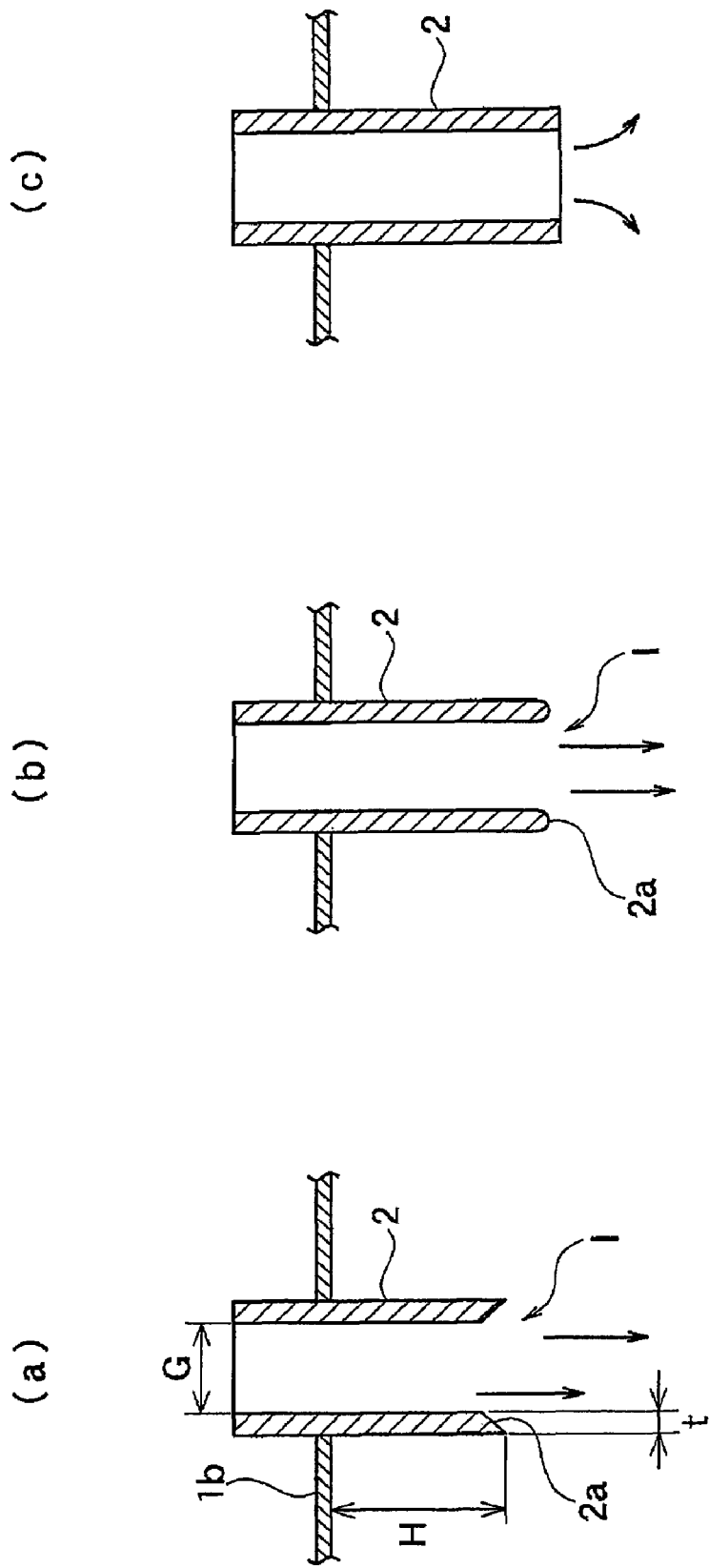

In the vertical reactor 1 used in the present invention, a diameter and a wall thickness of the silicon chloride gas-feeding nozzle 2 and an insertion length thereof into the reactor shall not specifically be restricted. However, considering formation and growth of tubular coagulated polycrystal silicon, preferably set are, as shown in FIG. 2(*a*) as examples, the diameter G to 10 to 100 mm, the wall thickness t to 2 to 15 mm and the insertion length H into the reactor to a length which is 0 to 500 mm longer from the tip of the reducing agent gas-feeding nozzle. The same one as the material of the reactor, for example, quartz or silicon carbide can be used as the material of the nozzles.

The number of the silicon chloride gas-feeding nozzle 2 shall not specifically be restricted as long as the gases discharged from the adjacent nozzles are interfered with each other to disturb the flow, and it may be one nozzle or two or more nozzles. Further, if the nozzle 2 is branched in the middle and has two way or more branches or it is branched in two or more ways and has combination of different nozzle diameters, polycrystal silicon is formed and grows at all of the nozzles in the similar manner observing with the passage of time. Accordingly, the number of the nozzle 2 shall not be restricted by the branches of the nozzle and the combination of the nozzle diameters, and the number of the nozzle and the intervals thereof may suitably be set up considering a size of polycrystal silicon to be grown and a dimension of the reactor. In FIG. 3, the disposing positions of the respective nozzles 2 and 3 in a case where four silicon chloride gas-feeding nozzles 2 and one reducing agent gas-feeding nozzle 3 are disposed are shown as an example.

That is, the reducing agent gas-feeding nozzle 3 is disposed, as shown in FIG. 3, approximately in a central part of a diameter direction in the reactor 1, and the silicon chloride gas-feeding nozzles 2 are radially disposed so that they surround the reducing agent gas-feeding nozzle 3 and are apart by a prescribed distance from an inner wall 1a of the cylindrical reactor 1. If the silicon chloride gas-feeding nozzles 2 are disposed in the above manner, four tubular coagulated polycrystal silicons growing at the aperture ends 2a of the nozzles can be allowed to grow downward at the same time without being brought into contact with the apparatus wall 1a.

Further, a gas guide means I for guiding a gas flow of silicon chloride downward is preferably worked, as shown in FIG. 2, at the aperture end 2a of the silicon chloride gas-feeding nozzle 2 in the present example.

In this case, the gas guide means I is constituted, to be specific, by tapering an inner circumferential surface of the aperture end 2a in a small thickness as shown in FIG. 2(a) or forming, as shown in FIG. 2(b), an aperture end edge so that it assumes roundness. Thus, if the suitable gas guide means I is worked at the aperture end 2a of the nozzle 2, the gas flow can be guided downward more straightly as compared with a case of FIG. 2(c) in which the tip part is perpendicularly cut, and tubular coagulated polycrystal silicons is liable to grow.

A feeding speed of the silicon chloride gas fed from the silicon chloride gas-feeding nozzles 2 shall not specifically be restricted as long as it does not form a turbulent flow, and considering formation and growth of tubular coagulated polycrystal silicon, the flow velocity is preferably 2400 mm/s or less when a discharge diameter of the feeding nozzle 2 is 50 mm.

A dimension of the vertical reactor used in the present invention shall not specifically be restricted, and from the viewpoint of the formation and growth of the tubular coagulated polycrystal silicon described above, the width and the depth are preferably 250 mm or more, and the height is preferably 500 to 5000 mm in order to prevent the vertical reactor from being damaged by dropping impact of tubular coagulated polycrystal silicon.

From the viewpoint of the formation and growth of the tubular coagulated polycrystal silicon, the silicon chloride gas-feeding nozzle is preferably inserted and disposed perpendicularly from an upper part of the reactor so that a distance between the perpendicular line and the wall of the reactor is 50 mm or more.

Further, in the vertical reactor 1 used in the present example, a diameter and a wall thickness of the reducing agent gas-feeding nozzle 3 and an insertion length thereof into the reactor shall not specifically be restricted, and they may be set up approximately in the same manner as in the case of the silicon chloride gas-feeding nozzle 2 shown in FIG. 2. However, the insertion length of the reducing agent gas-feeding nozzle 3 is preferably shorter, as shown in FIG. 1(d), by about 150 mm as compared with the insertion length of the silicon chloride gas-feeding nozzle 2. The same one as the material of the reactor, for example, quartz or silicon carbide can be used as the material of the nozzles.

The mounting position and the number of the reducing agent gas-feeding nozzle 3 shall not specifically be restricted as long as the reducing agent gas can sufficiently be diffused in the reactor, and it may be disposed on a top panel 1b at an upper part of the reactor or disposed on a side face or a bottom face and may be one nozzle or two or more nozzles. However, considering handling, it is preferably disposed by hanging downward perpendicularly from the top panel 1b.

In the vertical reactor 1 used in the present invention, a feeding speed of the reducing agent gas fed from the reducing agent gas-feeding nozzles 3 shall not specifically be restricted as long as it is a speed which does not disturb the flow of the silicon chloride gas in the reactor, and from the viewpoint of not disturbing the flow of the silicon chloride gas in the reactor, the flow velocity at an outlet of the feeding nozzle is preferably 1500 mm/s or less.

A shape and a diameter of the waste gas discharge pipe 4 shall not specifically be restricted as long as the waste gas can sufficiently be discharged without intentionally disturbing the flow of the silicon chloride gas. In general, the waste gas discharge pipe 4 is mounted in a central or eccentric position at a lower part of the vertical reactor, but it may be mounted on a side face or a top panel of the reactor as long as it does not intentionally disturb the flow of the silicon chloride gas. Also, the number of the waste gas discharge pipe 4 shall not specifically be restricted as well as long as it does not intentionally disturb the flow of the silicon chloride gas, and it may be single pipe or two or more pipes.

A protruding length of the discharge pipe described above into the reactor is required to some extent for preventing short pass of the silicon chloride gas or the reducing agent gas, but it shall not specifically be restricted, as described above, as long as it does not exert a large effect on controlling the flow of the silicon chloride gas.

A nozzle for feeding a carrier gas such as a nitrogen gas may be disposed in the vertical reactor 1 used in the present invention.

The fundamental constitution of the production apparatus for high purity polycrystal silicon using the vertical reactor of the present invention has been described above, and a case where it is incorporated into an actual production line shall be further explained below.

In the production process of the present invention for high purity polycrystal silicon, used is, as schematically shown in FIG. 1(a), the vertical reactor 1 comprising the silicon chloride gas-feeding nozzle 2, the reducing agent gas-feeding nozzle 3 and the waste gas discharge pipe 4, in which the silicon chloride gas-feeding nozzle 2 is inserted and installed from an upper part of the reactor into an inside of the reactor.

FIG. 4 is a schematic drawing showing one example of a polycrystal silicon production facility into which the production apparatus for high purity polycrystal silicon according to the present invention is incorporated. However, the present invention shall not be restricted to the above descriptions and includes as well a scope in which the invention can suitably be altered by so-called persons having an ordinary skill in the art based on the descriptions of the whole part of the specification.

As shown in FIG. 4, a reducing agent A is gasified by means of a melting furnace 5 and an evaporating furnace 6, and silicon chloride B is gasified by means of a vaporizing device 8. The melting furnace 5 and the like become unnecessary in a certain case depending on the kind and the form of the raw materials used. The gasified reducing agent A and the gasified silicon chloride B are heated to 800 to 1200° C. which is temperature suited to reductive reaction by an overheating furnace 7 which is a preliminary step of the reactor 1, and then they are fed to the reactor 1 which is heated to 800 to 1200° C. by a reactor heating furnace 9. When a reactor in which a raw material gas heating zone is provided is used, it is possible as well to feed them at lower temperature than the temperature described above and heat them up to temperature suited to reaction in the inside.

The silicon chloride gas fed from the silicon chloride gas-feeding nozzle 2 into the reactor 1 is quickly reduced by the reducing agent gas fed from the reducing agent gas-feeding nozzle 3 to be turned into silicon. Resulting silicon is adhered immediately to a tip of the silicon chloride gas-feeding nozzle 2, and silicon crystal grows toward a lower part of the nozzle while coagulated in a tubular form with this being a starting point. When this tubular coagulated polycrystal silicon grows to a length of some extent, it drops out from the nozzle by its own weight or mechanical shock and falls down to a lower part of the reactor. Then, the raw materials are further continued to be successively fed, and new tubular coagulated polycrystal silicon grows on the silicon chloride gas-feeding nozzle 2.

In the production apparatus of the example described above, it is shown that each one nozzle of the silicon chloride gas-feeding nozzle 2 and the reducing agent gas-feeding nozzle 3 is inserted into the inside of the reactor 1, but the fact is, as shown in FIG. 3, that plural silicon chloride gas-feeding nozzles 2 are disposed around one reducing agent gas-feeding nozzle 3.

Figure 5:
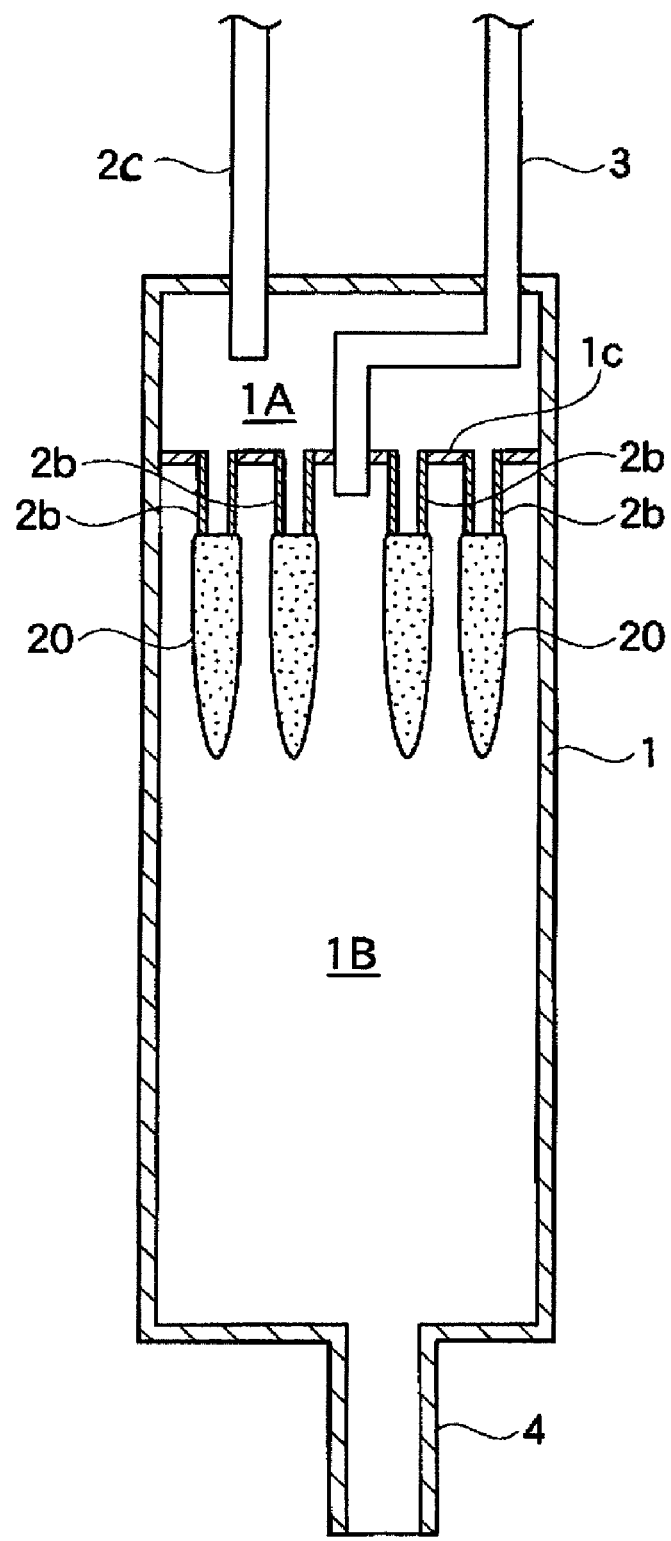
FIG. 5 is an essential part cross-sectional drawing showing another example of the production apparatus for polycrystal silicon according to the present invention.
Figure 6:
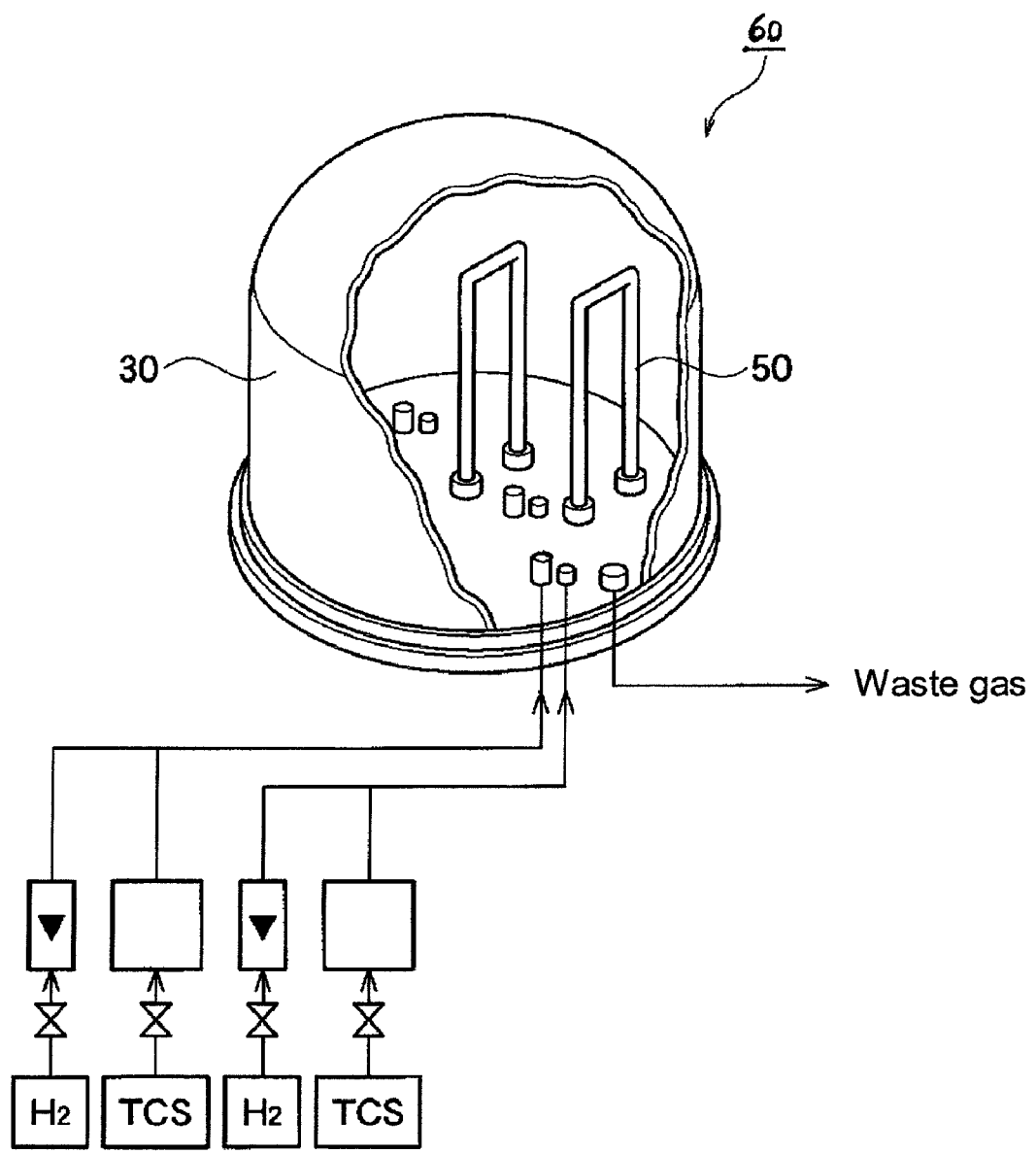
FIG. 6 is an outline drawing of a production apparatus by a Siemens process which has so far widely been carried out.

Further, in the present example, the silicon chloride gas-feeding nozzle 2 and the reducing agent gas-feeding nozzle 3 are independently inserted directly into the reactor 1, but the present invention shall not be restricted to it. For example, when plural silicon chloride gas-feeding nozzles 2 are provided, an upper flow side part 2c is common as shown in FIG. 5, and only a down flow side part 2b can be branched into a plurality. That is, in the example of FIG. 5, a small chamber 1A is formed by a partition wall 1c at an upper pat of the reactor 1, and the upper flow side part 2c of the silicon chloride gas-feeding nozzle 2 is opened in the small chamber 1A. Plural down flow side parts 2b are opened in a reaction chamber 1B under the partition wall 1c. The down flow side parts 2b are disposed radially, as shown in FIG. 3, versus the reducing agent gas-feeding nozzle 3.

Thus, if assumed is a structure in which a down flow side of the silicon chloride gas-feeding nozzle 2 is branched and independent, tubular coagulated polycrystal silicon can be produced at a tip part of the down flow side part 2b of the silicon chloride gas-feeding nozzle 2.

Polycrystal silicon C which grows in the reactor 1 and drops out is cooled at a lower part of the reactor or by a cooling•crushing device 10 and crushed if necessary, and then it can be discharged to the outside of the reactor by means of a valve of a shutter type provided at the cooling•crushing device 10 or the bottom of the reactor. Or, a lower part of the reactor is heated at 1420° C. or higher which is a melting point of silicon, whereby silicon can be taken out as well to the outside of the reactor in a molten state (a state of a silicon melt).

Chloride of the reducing agent (for example, zinc chloride), unreacted silicon chloride and reducing agent and polycrystal silicon produced in a waste gas discharge route are contained in a waste gas discharged from the waste gas discharge pipe 4. Accordingly, reducing agent chloride D and unreacted silicon chloride E are recovered by using, for example, a reducing agent chloride recovering tank 11, a silicon chloride condensing device (1) 12 and a silicon chloride condensing device (2) 13 and reused, and waste gas which can not be reused is suitably disposed by a waste gas disposing equipment F.

In the production apparatus for high purity polycrystal silicon in the present example, fed into the vertical reactor 1 are the silicon chloride gas from the silicon chloride gas-feeding nozzle 2 and the reducing agent gas from the reducing agent gas-feeding nozzle 3. Tubular coagulated polycrystal silicon is formed at a tip part 2a of the silicon chloride gas-feeding nozzle 2 by reaction thereof without using a seed bar used in the Siemens process, and the tubular coagulated polycrystal silicon is allowed to grow downward from the nozzle tip part.

In the present example, polycrystal silicon is allowed to grow, as exemplified in FIG. 1(e) and FIG. 5, in a manner in which silicon crystal is coagulated in a tubular form and hangs on the silicon chloride gas-feeding nozzle 2. Accordingly, tubular coagulated polycrystal silicon can be allowed to grow without being brought into contact with an inner wall surface 1a of the reactor. This makes it possible to obtain high purity polycrystal silicon without being contaminated by the material of the reactor. Because of the reason described above, involved therein is the advantage that it is not restricted to a large extent by the material constituting the reactor, the sealing material and the combination of these constitutional materials. Materials having a resistance in a use temperature range, for example, quartz or silicon carbide can be used as the material for the reactor.

The high purity polycrystal silicon in the present invention means polycrystal silicon which can be used as a raw material for silicon for solar batteries and as a raw material for silicon for semiconductors.

In the production process of the present invention, a face direction of polycrystal silicon in a crystal growth direction is a (111) face. Segregation of impurities contained in silicon on a crystal interface (surface) by growth of monolithic crystal with anisotropy in a specific face direction is considered to be a factor in which polycrystal silicon having a high purity is obtained.

Tubular coagulated polycrystal silicon allowed to grow in the manner described above becomes heavier as it grows, and it comes off from the silicon chloride gas-feeding nozzle 2 by its own weight and falls, and therefore clogging of the nozzle 2 is not caused. Tubular coagulated polycrystal silicon which grows to a suitable length can be allowed as well to fall down by a mechanical method such as vibrating and scratching off. The polycrystal silicon thus allowed to fall is cooled in a cooling zone provided at a lower part of the reactor or molten by heating a lower part of the reactor at a temperature of not lower than a melting point of silicon to prepare a silicon melt, and then it can continuously be taken out to the outside of the reactor from the bottom of the reactor. This makes it possible to constitute a process in which high purity polycrystal silicon is continuously obtained without stopping operation and makes it possible to stably produce inexpensive high purity polycrystal silicon in a large amount.

Gases such as chlorosilanes described in Table 1 represented by $Si_mH_nCl_{2m+2n}$ (m is a integer of 1 to 3, and n is a integer of 0 or more which does not exceed 2m+2) can be used as the silicon chloride gas used in the present invention, and among them, silicon tetrachloride gas is preferred because it is readily available, does not produce complicated by-products and is easily recovered. Metal reducing agent gases of sodium (Na), potassium (K), magnesium (Mg) and zinc (Zn) and hydrogen gas ($H_2$) can be used as the reducing agent gas, and among them, a zinc gas is preferred because it has a relatively low affinity to oxygen and can safely be handled.

carry out reaction for 8 hours. The result of calculation showed that a flow velocity of the silicon tetrachloride gas at a nozzle outlet was 1250 to 1750 mm/s and that a flow velocity of the zinc gas at a nozzle outlet was 800 to 1100 mm/s.

The silicon tetrachloride gas and the zinc gas were stopped feeding, and the reactor was cooled down. Then, it was broken down, and an inside thereof was observed to confirm that polycrystal silicon in which silicon crystal was coagulated in

TABLE 1

| m | 2m+2 | n=0 | n=1 | n=2 | n=3 | n=4 | n=5 | n=6 | n=7 |
|---|---|---|---|---|---|---|---|---|---|
| 1 | 4 | $SiCl_4$ | $SiHCl_3$ | $SiH_2Cl_2$ | $SiH_3Cl$ | — | — | — | — |
| 2 | 6 | $Si_2Cl_6$ | $Si_2HCl_5$ | $Si_2H_2Cl_4$ | $Si_2H_3Cl_3$ | $Si_2H_4Cl_2$ | $Si_2H_5Cl$ | — | — |
| 3 | 8 | $Si_3Cl_8$ | $Si_3HCl_7$ | $Si_3H_2Cl_6$ | $Si_3H_3Cl_5$ | $Si_3H_4Cl_4$ | $Si_3H_5Cl_3$ | $Si_3H_6Cl_2$ | $Si_3H_7Cl$ |

The feeding amounts of the silicon chloride gas and the reducing agent gas shall not specifically be restricted as long as they are amounts by which the reductive reaction sufficiently proceeds, and silicon chloride gas : reducing agent gas in terms of a molar ratio is 1:10 to 10:1, preferably 1:4 to 4:1. Feeding of the silicon chloride gas and the reducing agent gas in a ratio falling in the range described above makes it possible to stably form and allow polycrystal silicon to grow.

The reaction of the silicon chloride gas with the reducing agent gas is carried out in a range of 800 to 1200° C., preferably 850 to 1050° C. Accordingly, the silicon chloride gas and the reducing agent gas which are heated in the temperature range described above are preferably fed into the reactor which is heated and controlled in the temperature range described above.

EXAMPLES

The present invention shall more specifically be explained with reference to examples, but the present invention shall not be restricted to these examples.

A purity of product silicon obtained was determined by determining metal elements (17 elements: Zn, Al, Ca, Cd, Cr, Cu, Co, Fe, Mn, Mo, Na, Ni, Pb, Sn, Ti, P and B) contained in a solution obtained after dissolving and removing silicon with $HF/HNO_3$ by high frequency induction plasma emission spectrometry (ICP•AES: model, Nippon Jarrell Ash Co., Ltd., type, IRIS-AP) and subtracting the sum of the determined values of the 17 elements from 100%.

Example A1

In a flow constituted in a schematic drawing shown in FIG. 4 as an example, used was a vertical cylindrical, silicon carbide (SiC)-made reactor having an inner diameter of 800 mm and a length of 1800 mm, in which one quartz-made silicon chloride gas-feeding nozzle and one quartz-made reducing agent gas-feeding nozzle, each having an inner diameter of 55 mm, a wall thickness of 5 mm and an insertion length of 100 mm, were disposed at a ceiling part and in which a waste gas discharge pipe was disposed at a lower wall surface. The respective nozzles were disposed apart by 100 mm from the tube wall. The above reactor was heated by means of an electric furnace so that the whole part reached about 950° C. Then, a silicon tetrachloride gas of 950° C. as a silicon chloride gas and a zinc gas of 950° C. as a reducing agent gas were fed from the respective feeding nozzles into the reactor so that silicon tetrachloride:zinc was 1.6:1 in terms of a molar ratio to a tubular form was produced immediately under the silicon chloride gas-feeding nozzle. The polycrystal silicon formed was peeled off by its own weight from the silicon chloride gas-feeding nozzle only by applying slight vibration and dropped on a bottom plate of the reactor. The polycrystal silicon was adhered only slightly onto the wall of the reactor. A weight of the polycrystal silicon thus obtained was 6.5 kg, and a purity thereof was 99.999% or more.

Example A2

The same reactor as used in Example A1 was used to carry out the same procedure as in Example A1, except that a silicon tetrachloride gas of 1000° C. as the silicon chloride gas and a zinc gas of 1000° C. as the reducing agent gas were fed from the respective feeding nozzles into the reactor so that silicon tetrachloride:zinc was 0.6:1 in terms of a molar ratio to carry out reaction for 6.5 hours.

The silicon tetrachloride gas and the zinc gas were stopped feeding, and the reactor was cooled down. Then, a lower part of the reactor was opened to confirm that polycrystal silicon in which silicon crystal was coagulated in a tubular form was adhered to the feeding nozzle of the silicon tetrachloride gas and hanged. The polycrystal silicon was adhered only slightly onto the wall of the reactor. A weight of the polycrystal silicon thus obtained was 5.1 kg, and a purity thereof was 99.999% or more.

Example A3

Used was a vertical cylindrical, quartz-made reactor having an inner diameter of 500 mm and a length of 1500 mm, in which six quartz-made silicon chloride gas-feeding nozzles having an inner diameter of 25 mm, a wall thickness of 2.5 mm and an insertion length of 200 mm were disposed at a ceiling part evenly on a circumference having a distance of 175 mm from a quartz-made reducing agent gas-feeding nozzle having an inner diameter of 35 mm, a wall thickness of 5 mm and an insertion length of 50 mm set in a center and in which a waste gas discharge pipe was disposed at a lower wall surface, and it was heated to 950° C. Then, a silicon tetrachloride gas of 950° C. as a silicon chloride gas and a zinc gas of 950° C. as a reducing agent gas were fed into the above reactor so that silicon tetrachloride:zinc was 0.8:1 in terms of a molar ratio to carry out reaction for 3 hours. The result of calculation showed that a flow velocity of the silicon tetrachloride gas per nozzle at a nozzle outlet was 800 to 1000 mm/s and that a flow velocity of the zinc gas at a nozzle outlet was 300 to 500 mm/s.

The silicon tetrachloride gas and the zinc gas were stopped feeding, and the reactor was cooled down. Then, a lower part of the reactor was opened to confirm that tubular coagulated polycrystal silicons each were adhered evenly to six feeding nozzles of the silicon tetrachloride gas and hanged. The polycrystal silicon was adhered only slightly onto the wall of the reactor. A weight of the polycrystal silicons thus obtained was 4.1 kg, and a purity thereof was 99.999% or more.

Example A4

The same reactor as used in Example A3 was used to carry out the same procedure as in Example A3, except that the gases were fed from the respective feeding nozzles so that silicon tetrachloride:zinc was 0.9:1 in terms of a molar ratio to carry out reaction for 8 hours. The result of calculation showed that a flow velocity of the silicon tetrachloride gas per nozzle at a nozzle outlet was 800 to 1000 mm/s and that a flow velocity of the zinc gas at a nozzle outlet was 300 to 400 mm/s.

The silicon tetrachloride gas and the zinc gas were stopped feeding, and the reactor was cooled down. Then, a lower part of the reactor was opened to confirm that tubular coagulated polycrystal silicons, which were adhered evenly to six feeding nozzles of the silicon tetrachloride gas and hanged, dropped on the bottom of the reactor. Only six tubular coagulated polycrystal silicons were found, and it was confirmed that they dropped from the nozzle ports by their own weights after the reaction. The polycrystal silicon was adhered only slightly onto the wall of the reactor. A weight of the polycrystal silicons thus obtained was 7.5 kg, and a purity thereof was 99.999% or more.

Example B1

In a flow constituted in a schematic drawing shown in FIG. 4 as an example, an inner circumferential surface of an aperture end of a silicon chloride gas-feeding nozzle was subjected in advance, as shown in FIG. 2(a), to working for reducing a wall thickness. Used was a vertical cylindrical, silicon carbide (SiC)-made reactor having an inner diameter of 800 mm and a length of 1800 mm, in which two quartz-made silicon chloride gas-feeding nozzles and one quartz-made reducing agent gas-feeding nozzle, each having an inner diameter of 55 mm, a wall thickness of 5 mm and an insertion length of 100 mm, were disposed at a ceiling part and in which a waste gas discharge pipe was disposed at a lower wall surface. The above reactor was heated by means of an electric furnace so that the whole part reached about 950° C. Then, a silicon tetrachloride gas of 950° C. as a silicon chloride gas and a zinc gas of 950° C. as a reducing agent gas were fed from the respective feeding nozzles into the above reactor so that silicon tetrachloride:zinc was 0.7:1 in terms of a molar ratio to carry out reaction for 7.5 hours. The result of calculation showed that a flow velocity of the silicon tetrachloride gas per nozzle at a nozzle outlet was 500 to 700 mm/s and that a flow velocity of the zinc gas at a nozzle outlet was 800 to 1200 mm/s.

The silicon tetrachloride gas and the zinc gas were stopped feeding, and the reactor was cooled down. Then, a lower part of the reactor was opened to find that polycrystal silicons formed were peeled off from the silicon chloride gas-feeding nozzles by their own weights and put on a reactor bottom plate. The polycrystal silicon was adhered only slightly onto the wall of the reactor. A weight of the polycrystal silicons thus obtained was 5.9 kg, and a purity thereof was 99.999% or more.

Example B2

The same reactor as used in Example B1 was used to carry out the same procedure as in Example B1, except that a silicon tetrachloride gas of 1000° C. as the silicon chloride gas and a zinc gas of 1000° C. as the reducing agent gas were fed from the respective feeding nozzles into the reactor so that silicon tetrachloride:zinc was 1.4:1 in terms of a molar ratio to carry out reaction for 8 hours.

The silicon tetrachloride gas and the zinc gas were stopped feeding, and the reactor was cooled down. Then, a lower part of the reactor was opened to confirm that tubular coagulated polycrystal silicons each were adhered to two feeding nozzles of the silicon tetrachloride gas and hanged. The polycrystal silicon was adhered only slightly onto the wall of the reactor. A weight of the polycrystal silicons thus obtained was 5.7 kg, and a purity thereof was 99.999% or more.

Example B3

Heated to 950° C. was a vertical cylindrical, quartz-made reactor having an inner diameter of 500 mm and a length of 1500 mm, in which six quartz-made silicon chloride gas-feeding nozzles having an inner diameter of 25 mm were subjected to working for rounding tips as shown in FIG. 2(b) and disposed at a ceiling part evenly on a circumference having a distance of 175 mm from a quartz-made reducing agent gas-feeding nozzle having an inner diameter of 35 mm set in a center and in which a waste gas discharge pipe was disposed at a lower wall surface. Then, a silicon tetrachloride gas of 950° C. as a silicon chloride gas and a zinc gas of 950° C. as a reducing agent gas were fed into the above reactor so that silicon tetrachloride:zinc was 0.8:1 in terms of a molar ratio to carry out reaction for 3 hours. The result of calculation showed that a flow velocity of the silicon tetrachloride gas per nozzle at a nozzle outlet was 800 to 1000 mm/s and that a flow velocity of the zinc gas at a nozzle outlet was 300 to 500 mm/s.

The silicon tetrachloride gas and the zinc gas were stopped feeding, and the reactor was cooled down. Then, a lower part of the reactor was opened to confirm that six tubular coagulated polycrystal silicons each were adhered evenly to the feeding nozzles of the silicon tetrachloride gas in a length of about 650 to 700 mm and hanged. The polycrystal silicon was adhered only slightly onto the wall of the reactor. A weight of the polycrystal silicons thus obtained was 4.1 kg, and a purity thereof was 99.999% or more.

Comparative Example 1

Used was a lateral cylindrical, quartz-made reactor having an inner diameter of 310 mm and a length of 2835 mm, in which one quartz-made silicon chloride gas-feeding nozzle having an inner diameter of 20 mm, a thickness of 5 mm and an insertion length of 400 mm and one quartz-made reducing agent gas-feeding nozzle having an inner diameter of 20 mm, a thickness of 5 mm and an insertion length of 100 mm were disposed at one end part and in which a waste gas discharge pipe was disposed at the other end part. The above reactor was heated by means of an electric furnace so that the whole part reached about 950° C. Then, a silicon tetrachloride gas of 950° C. as a silicon chloride gas and a zinc gas of 950° C. as a reducing agent gas were fed from the respective feeding nozzles into the reactor so that silicon tetrachloride:zinc was 0.7:1 in terms of a molar ratio to carry out reaction for 80 hours.

The silicon tetrachloride gas and the zinc gas were stopped feeding, and the reactor was slowly cooled down. Then, the end part of the reactor was opened to find that tubular coagulated polycrystal silicon was not observed to be formed and that acicular polycrystal silicons grew all over the inside of the reactor. Polycrystal silicons were adhered onto the wall of the quartz reactor at a high strength. When the polycrystal silicons were peeled off, the surface of quartz caused chipping, and high purity silicon recovered was mixed with a lot of broken pieces of quartz. A weight of the polycrystal silicons thus obtained was 12.5 kg.

In the present comparative example, the quartz-made reactor was broken due to a difference between the thermal expansion coefficient of polycrystal silicons adhered and that of quartz.

What is claimed is:

1. A production apparatus for high purity polycrystal silicon equipped with:
   a vertical reactor provided with a heating means on an outer circumferential surface,
   a silicon chloride gas-feeding nozzle inserted into the vertical reactor from an upper part to a lower part thereof,
   a reducing agent gas-feeding nozzle inserted into the vertical reactor only from an upper part to a lower part thereof and
   a waste gas discharge pipe connected with the reactor,
   wherein polycrystal silicon is allowed to grow in order at a tip part of the silicon chloride gas-feeding nozzle by the gas phase reaction of a silicon chloride gas introduced from the silicon chloride gas-feeding nozzle with a reducing agent gas introduced from the reducing agent gas-feeding nozzle, and
   a plurality of the silicon chloride gas-feeding nozzles is installed apart by a prescribed distance from an inner wall of the reactor so as to surround the reducing agent gas-feeding nozzle, whereby silicon crystal formed in the reactor is adhered to the tip part of the silicon chloride gas-feeding nozzle, and then it is coagulated and allowed to grow in a tubular form toward a lower part.

2. The production apparatus for high purity polycrystal silicon as described in claim 1, wherein an aperture end of the reducing agent gas-feeding nozzle is disposed at an upper part than an aperture end of the silicon chloride gas-feeding nozzle.

3. The production apparatus for high purity polycrystal silicon as described in claim 1, wherein a gas guide means for guiding a gas flow downward is worked at an aperture end of the silicon chloride gas-feeding nozzle.

4. The production apparatus for high purity polycrystal silicon as described in claim 2, wherein a gas guide means for guiding a gas flow downward is worked at the aperture end of the silicon chloride gas-feeding nozzle.

5. The production apparatus for high purity polycrystal silicon as described in claim 3, wherein the gas guide means is constituted so that an interfacial surface of the nozzle is formed in a smaller thickness toward the aperture end thereof.

6. The production apparatus for high purity polycrystal silicon as described in claim 4, wherein the gas guide means is constituted so that an interfacial surface of the nozzle is formed in a smaller thickness toward the aperture end thereof.

* * * * *